(12) United States Patent
France et al.

(10) Patent No.: US 6,428,861 B2
(45) Date of Patent: Aug. 6, 2002

(54) APPARATUS AND PROCESS FOR PLASMA TREATMENT OF PARTICULATE MATTER

(75) Inventors: Paul Amaat France, West Chester; Arseni V. Radomyselski, Hamilton; Saswati Datta, Cincinnati, all of OH (US)

(73) Assignee: Procter & Gamble Company, Cincinnati, OH (US)

( * ) Notice: Subject to any disclaimer, the term of this patent is extended or adjusted under 35 U.S.C. 154(b) by 0 days.

(21) Appl. No.: 09/879,593

(22) Filed: Jun. 12, 2001

Related U.S. Application Data
(60) Provisional application No. 60/211,288, filed on Jun. 13, 2000.

(51) Int. Cl.[7] ............................................. C23C 16/00
(52) U.S. Cl. .................... 427/488; 118/716; 118/723 R
(58) Field of Search .......................... 427/488; 118/716, 118/723 R

(56) References Cited

U.S. PATENT DOCUMENTS
6,169,127 B1 * 1/2001 Lohmann et al. ........... 523/106

FOREIGN PATENT DOCUMENTS
JP            06145212 A    *    5/1994

* cited by examiner

*Primary Examiner*—James Seidleck
*Assistant Examiner*—Olga Asinovsky
(74) *Attorney, Agent, or Firm*—C. Brant Cook; Kim W. Zerby; Steve W. Miller

(57) ABSTRACT

A process for plasma treatment of particulate matter, and more particularly, an apparatus for plasma induced graft polymerization of particulate matter in a continuous or semi-continuous manner, and a process for plasma induced graft polymerization of particulate matter in a continuous or semi-continuous manner is provided.

17 Claims, 1 Drawing Sheet

APPARATUS AND PROCESS FOR PLASMA TREATMENT OF PARTICULATE MATTER

CROSS REFERENCE TO RELATED APPLICATIONS

This application claims priority under 37 U.S.C. § 119(e) to U.S. Provisional Application Serial No. 60/211,288, filed Jun. 13, 2000.

TECHNICAL FIELD

The present invention generally relates to a process for plasma treatment of particulate matter, and more particularly, to an apparatus for plasma induced graft polymerization of particulate matter in a continuous or semi-continuous manner, and a process for plasma induced graft polymerization of particulate matter in a continuous or semi-continuous manner.

BACKGROUND OF THE INVENTION

Thin film technologies are widely used to modify surface properties such as wettability, hardness, abrasion, adhesion, permeability, refractive index and biocompatibility of particles. Plasma enhanced chemical vapor deposition (PECVD) is one example of a particularly useful technique for modifying such surface properties. As PECVD operates under vacuum, it is possible to lower the deposition temperature and thereby to improve the quality of the coating. This is especially the case for coating of temperature sensitive powders. If a suitable organic vapor (monomer) is introduced into a plasma, or when a plasma of an organic vapor is created, polymerization of the vapor occurs and a polymeric film is formed, which can be deposited to a temperature sensitive powder. Energetic species from the plasma such as ions, atoms, metastables, as well as electrons and a broad electromagnetic spectrum, dissociate or modify the gaseous monomers to form precursors, which chemically react and lead to the desired film formation. An electrical field is applied that accelerates the free electrons in the discharge, which then deliver energy to the atoms or molecules through collisions. Typically the degree of ionization is less than 0.1%. This allows gas temperatures to be kept below 100° C. and treatment of heat sensitive powders. Hence the PECVD method provides a means of surface coating since such a polymer deposition can be highly crosslinked and strongly bonded to the surface.

The surface characteristics of powders or pigments is a very important factor when powders are used in many industrial applications. Powders including carbon black, zinc oxide, titanium oxide, pigment, silica, mica and zeolite are useful raw materials in rubber, electronic, paint and petrochemical industries. The surface properties influence the flowability, dispersability, solubility and adhesive properties of powders. In many applications it is necessary to alter the surface characteristics of the powders from hydrophobic to hydrophilic or inversely from hydrophilic to hydrophobic without changing the bulk properties. Plasma polymerization techniques offer the opportunity to deliver the powders an uniform, ultrathin and pinhole free coating and consequently, many applications have surfaced in the past few years.

Several prior art studies have reported work on cold plasma treatment of fillers (mica, silica) used in engineering plastics. In one study, a Ar-$C_3H_6$ plasma was used to modify the surface of calcium carbonate powder and the immersion of heat measurement was used as the evaluation method of the surface modification effect. Another study has shown that it has been possible to increase the dispersion rate and dispersion stability of $NH_3$— and $O_2$-plasma treated pigments in water soluble acrylic resin systems. Yet another study has disclosed the use of low-temperature gas plasma treatment of waxes in a rotating drum reactor, and it has been found that increasing their wettability related to improved dispersability, emulsifiability, solubility and reactivity towards a wide variety of materials.

It is known that plasma fluidized bed reactors can provide intimate mixing between the powders and the reactive gas to improve both the reaction rate and the uniformity of the treated surface. Powder is placed on the porous plate in the reactor, which is positioned vertically, and a gas is injected from the gas inlet at the bottom of the reactor. The gas passes up through a bed of the powder. At more than a critical flow rate of the gas stream the pressure drops and the drag on individual powder increases. As result, the powders start to move and become suspended in the fluid. This state is called "fluidization" and means the condition of fully suspended particles. In certain cases, a vibrator can be connected to the reactor for maintaining the powder in the jiggling fluidized-bed state.

When a particle is traveling through a plasma containing an organic monomer, a film of a plasma-polymerized organic material is deposited even on high surface area (>100 $m^2$/g) particles. The difficulty in this process, which has thus far impeded its large-scale utilization, is the lack of good contact between the substrate and the plasma. In contrast to flat surfaces there is still no satisfactory process for coating powders and granules. Conventional reactors, such as barrel- or jar-type, cannot be used for powder materials due to the lack of solid mixing. Thus, the inventors of the present invention have conducted a variety of theoretical and experimental studies to improve the plasma-particle reactions.

It is difficult to do plasma treatment of powders because of aggregation and large surface area per unit of mass of the powder. The stability of plasmas in fluidized beds can be negatively affected by interactions of particles with the plasma. Particles may directly absorb radio frequency or microwave energy or they could collide with excited gas species, namely the electrons and reduce the electron density. When the solids concentration gets too high, large parts of the plasma volume can be affected and as a consequence the plasma could extinguish. It is known that the presence of a radio frequency glow discharge greatly reduces the agglomeration of particles in the fluidized-fed preparation of calcium superoxide from calcium peroxide diperoxyhydrate. The reduced agglomeration is possibly due to the reduction of static charges. However, in order to prepare powders in a fluidized reactor, research not only on chemical reactions but also on powder handling becomes critical. While the particles handled in conventional fluidized beds are mostly larger than 10–30 microns, it is precisely the plasma treatment of micron-sized particles that remains a challenge.

Thus it has been desirable to conduct further research on efficient reactor design and reactor modeling. It has been extremely desirable to have a new and improved process for plasma induced graft polymerization of particulate matter in a continuous or semi-continuous manner, because conventional models for fluidization reactors seem not to be applicable to plasma reactors.

The following invention is directed to overcome one or more problems, as set forth above.

SUMMARY OF THE INVENTION

The present invention discloses an apparatus for plasma induced graft polymerization of particulate matter in a continuous or semi-continuous manner, and a process for plasma induced graft polymerization of particulate matter in a continuous or semi-continuous manner.

In one aspect of the present invention, an apparatus for plasma induced graft polymerization of particulate matter in a continuous or semi-continuous manner includes a vacuum processing chamber which comprises a first hopper section, a longitudinal middle section, and a second hopper section. The first hopper section has an inlet, a closed end, a longitudinal middle portion and an open end. The first hopper section is oriented along a first longitudinal axis. The inlet of the first hopper section is removably connectable to a particulate matter feed valve. The longitudinal middle section has a first open end, a longitudinal middle portion, and a second open end. The longitudinal middle section is oriented along the first longitudinal axis. The vacuum processing chamber is rotatable at the mid-point of the longitudinal middle section through at least 180 degrees about a second longitudinal axis. The second longitudinal axis is perpendicular to the first longitudinal axis. The second hopper section has an inlet, a closed end, a longitudinal middle portion and an open end. The second hopper section is oriented along the first longitudinal axis, and the inlet of the second hopper section is removably connectable to a polymerizable liquid monomer feed valve. The open end of the first hopper section is connected with the first open end of the longitudinal middle section through a first valve, and the open end of the second hopper section is connected with the second open end of the longitudinal middle section through a second valve. The particulate matter feed valve is removably connected to the inlet of the first hopper section and the polymerizable liquid monomer feed valve is removably connected to the inlet of the second hopper section when the vacuum processing chamber is at a rotational position "a". The particulate matter feed valve is removably connected to the inlet of the second hopper section and the polymerizable liquid monomer feed valve is removably connected to the inlet of the first hopper section when the vacuum processing chamber is at a rotational position "b". Further, the rotational position "b" is 180 degrees with respect to the rotational position "a". The first hopper section is adapted to deliver untreated and plasma treated particulate matter to the longitudinal middle section and the second hopper section is adapted to receive one or more of plasma treated particulate matter from the longitudinal middle section and the polymerizable liquid monomer when the vacuum processing chamber is at rotational position "a". The second hopper section is adapted to deliver untreated and plasma treated particulate matter to the longitudinal middle section and the first hopper section is adapted to receive one or more of the plasma treated particulate matter from the longitudinal middle section and the polymerizable liquid monomer when the vacuum processing chamber is at rotational position "b". The longitudinal middle section is connected to a vacuum generation pump means for maintaining an vacuum or near-atmospheric pressure therein. The longitudinal middle section has plasma generating electrodes disposed therein for generating a plasma glow discharge by using a non-polymerizable plasma gas. The particulate matter is exposed to the plasma glow discharge as the particulate matter descends through the longitudinal middle section under gravity.

In another aspect of the present invention, a process for plasma induced graft polymerization of particulate matter in a continuous or semi-continuous manner includes the steps of providing a vacuum processing chamber which comprises a first hopper section, a longitudinal middle section, and a second hopper section. The first hopper section has an inlet, a closed end, a longitudinal middle portion and an open end. The first hopper section is oriented along a first longitudinal axis. The inlet of the first hopper section is removably connectable to a particulate matter feed valve. The longitudinal middle section has a first open end, a longitudinal middle portion, and a second open end. The longitudinal middle section is oriented along the first longitudinal axis. The vacuum processing chamber is rotatable at the mid-point of the longitudinal middle section through at least 180 degrees about a second longitudinal axis. The second longitudinal axis is perpendicular to the first longitudinal axis. The second hopper section has an inlet, a closed end, a longitudinal middle portion and an open end. The second hopper section is oriented along the first longitudinal axis, and the inlet of the second hopper section is removably connectable to a polymerizable liquid monomer feed valve. The open end of the first hopper section is connected with the first open end of the longitudinal middle section through a first valve, and the open end of the second hopper section is connected with the second open end of the longitudinal middle section through a second valve. The particulate matter feed valve is removably connected to the inlet of the first hopper section and the polymerizable liquid monomer feed valve is removably connected to the inlet of the second hopper section when the vacuum processing chamber is at a rotational position "a". The particulate matter feed valve is removably connected to the inlet of the second hopper section and the polymerizable liquid monomer feed valve is removably connected to the inlet of the first hopper section when the vacuum processing chamber is at a rotational position "b". Further, the rotational position "b" is 180 degrees with respect to the rotational position "a". The process further includes the steps of rotating the vacuum processing chamber about the second longitudinal axis such that the vacuum processing chamber is at a rotational position "a". The process further includes providing particulate matter into the first hopper section through the particulate matter feed valve, providing a vacuum of at least 500 mTorr in the longitudinal middle section and creating a plasma glow discharge in the longitudinal middle portion by the non-polymerizable gas to form a plasma zone. The process still further includes dropping the particulate matter from one of (i) first hopper section and (ii) second hopper section, into the plasma zone in the longitudinal middle section, and treating the particulate matter in the plasma zone as the particulate matter descends through the longitudinal middle section. Thereafter, the process includes collecting the plasma treated particulate matter in one of the first hopper section and the second hopper section, and rotating the vacuum processing chamber about the second longitudinal axis such that the vacuum processing chamber is at a rotational position "b". The steps of dropping, treating, and collecting the particulate matter and rotating the vacuum chamber are repeated for a number of times sufficient to obtain a total residence time in a range of from about 0.001 seconds to 60 seconds. The process then includes providing the polymerizable liquid monomer into one of the first hopper section and the second hopper section, through the polymerizable liquid monomer valve and finally, exposing treated particulate matter to the polymerizable liquid monomer.

DETAILED DESCRIPTION OF THE INVENTION

Figure 1:
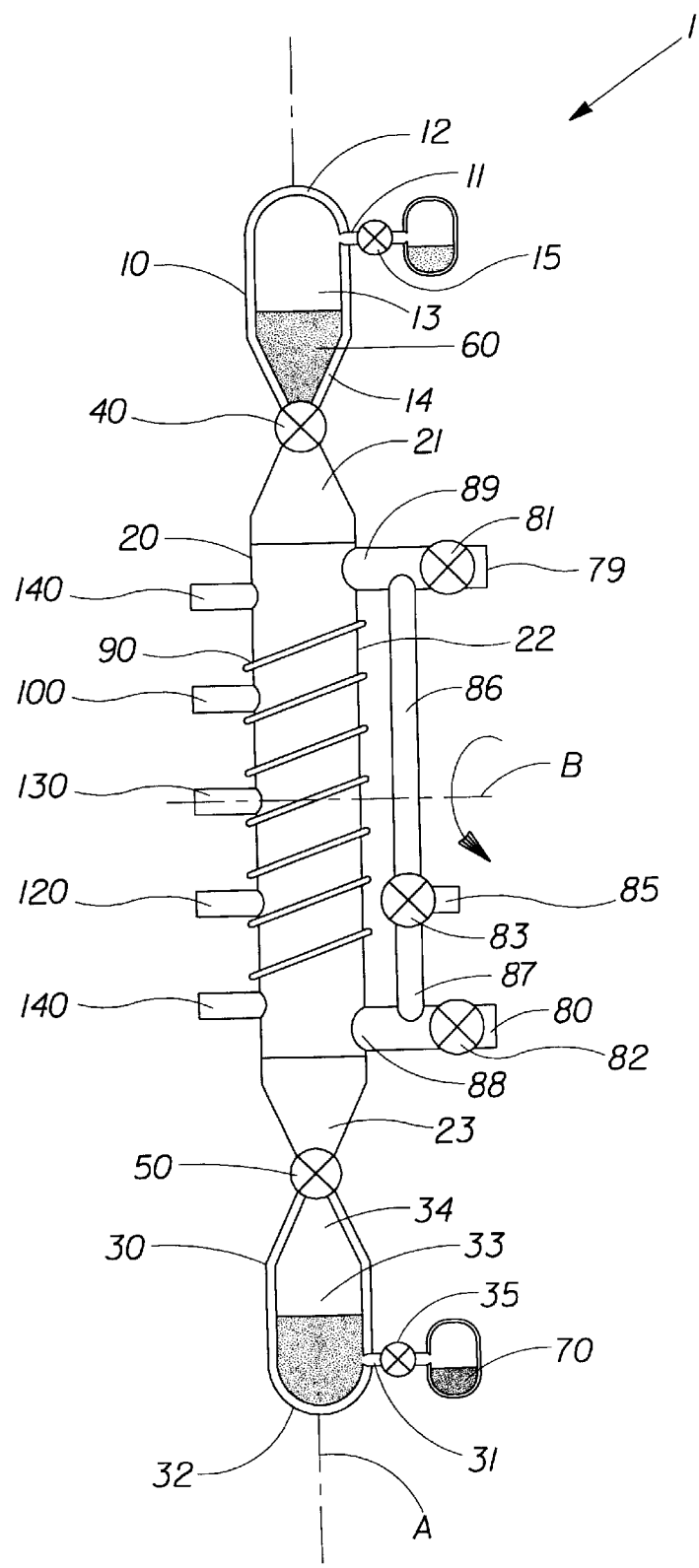
FIG. 1 is a schematic illustration of a preferred apparatus in accordance with the present invention.

Referring now to FIG. 1, in the preferred embodiment of the present invention, the apparatus, a vacuum processing chamber 1 for plasma induced graft polymerization of particulate matter in a continuous or semi-continuous manner includes a vacuum processing chamber comprises a first hopper section 10, a longitudinal middle section 20, and a second hopper section 30.

The first hopper section 10 has an inlet 11, a closed end 12, a longitudinal middle portion 13 and an open end 14. The first hopper section 10 is oriented along a first longitudinal axis A. The inlet 11 of the first hopper section 10 is removably connectable to a particulate matter, preferably monomer feed valve 15.

The longitudinal middle section 20 has a first open end 21, a longitudinal middle portion 22, and a second open end 23. The longitudinal middle section 20 is oriented along the first longitudinal axis A. The vacuum processing chamber 1 is rotatable at the mid-point of the longitudinal middle section 20 through at least 180 degrees about a second longitudinal axis B. The second longitudinal axis B is perpendicular to the first longitudinal axis A.

The second hopper section 30 has an inlet 31, a closed end 32, a longitudinal middle portion 33 and an open end 34. The second hopper section 30 is oriented along the first longitudinal axis A, and the inlet 31 of the second hopper section 30 is removably connectable to a polymerizable liquid monomer feed valve 35.

The open end 14 of the first hopper section 10 is connected with the first open end 21 of the longitudinal middle section 20 through a first valve 40, and the open end 34 of the second hopper section 30 is connected with the second open end 23 of the longitudinal middle section 20 through a second valve 50.

The monomer feed valve 15 is removably connected to the inlet 11 of the first hopper section 10 and the polymerizable liquid monomer feed 35 valve is removably connected to the inlet 31 of the second hopper section 30 when the vacuum processing chamber 1 is at a rotational position "a". The monomer feed valve 15 is removably connected to the inlet 31 of the second hopper section 30 and the polymerizable liquid monomer feed valve 35 is removably connected to the inlet 11 of the first hopper section 10 when the vacuum processing chamber 1 is at a rotational position "b". Further, the rotational position "b" is 180 degrees with respect to the rotational position "a".

The first hopper section 10 is adapted to deliver untreated and plasma treated particulate matter 60 to the longitudinal middle section 20 and the second hopper section 30 is adapted to receive one or more of plasma treated particulate matter 60 from the longitudinal middle section 20 and the polymerizable liquid monomer 70 when the vacuum processing chamber 1 is at rotational position "a". The second hopper section 30 is adapted to deliver untreated and plasma treated particulate matter to the longitudinal middle section 20 and the first hopper section 10 is adapted to receive one or more of the plasma treated particulate matter from the longitudinal middle section 20 and the polymerizable liquid monomer 70 when the vacuum processing chamber 1 is at rotational position "b".

The longitudinal middle section 20 is preferably connected to a vacuum generation pump means via inlets 80 and 85 for maintaining a vacuum or near-atmospheric pressure therein. The longitudinal middle section 20 has a plasma generating system, preferably plasma generating coils 90 which are preferably wrapped around the exterior wall of the longitudinal middle section 20 such that the coils 90 are preferably contacting the exterior walls of the longitudinal middle section 20 and preferably the coils 90 are co-aligned with the first longitudinal axis A. Nonlimiting examples of other suitable plasma generating systems include plasma generating coils embedded into the walls of the longitudinal middle section 20, plasma generating coils arranged inside the longitudinal middle section, plasma generating electrodes embedded into the walls of the longitudinal middle section 20 and/or plasma generating electrodes arranged inside the longitudinal middle section 20.

The plasma generating system can generate a plasma glow discharge by using a non-polymerizable plasma gas. The particulate matter 60 is exposed to the plasma glow discharge as the particulate matter 60 descends through the longitudinal middle section 20 under gravity. Preferably, the longitudinal middle section 20 is connected to a pressure sensor for measuring the pressure therein.

In the preferred embodiment of the apparatus 1 of the present invention, the longitudinal middle section 20 is connected to an optical emission spectrometer means 100 for plasma diagnostics. Such means include a S2000 spectrometer manufactured by Ocean Optics Inc. The purpose of this device is to analyze plasma activated chemical species.

In the preferred embodiment of the apparatus of the present invention, the longitudinal middle section 20 is connected to mass spectrometer means 120 for plasma diagnostics. Such means include a Residual Gas Analyzer manufactured by Stanford Research. The purpose of this device is to analyze chemical species present in the chamber.

In the preferred embodiment of the apparatus of the present invention, the longitudinal middle section 20 is connected to langmuir probe means 130 for plasma diagnostics. Such means include a SmartProbe manufactured by Scientific Systems. The purpose of this device is to measure electron density of the plasma.

In the preferred embodiment of the apparatus of the present invention, the longitudinal middle section 20 is connected to pressure sensing means 140 for sensing the pressure inside the longitudinal middle section 20. Such means include a MKS 266 pressure transducer manufactured MKS Inc. The purpose of this device is to measure vacuum level.

In the preferred embodiment, the vacuum generation pump means via inlets 80 and 85 is adapted to produce a vacuum of desirably at least about 500 mTorr, and more preferably at least about 100 mTorr, even more preferably at least about 20 mTorr. This vacuum is desirable because it reduces plasma temperature and increases electron density.

In the preferred embodiment of another aspect of this invention, a process for plasma induced graft polymerization of particulate matter in a continuous or semi-continuous manner includes the steps of providing a vacuum processing chamber 1 as set forth above.

Referring again to FIG. 1, in the preferred embodiment of the process, the vacuum processing chamber 1 is first rotated about the second longitudinal axis B such that the vacuum processing chamber 1 is at a rotational position "a", as shown in FIG. 1.

Preferred process (position a):

Plasma gas is introduced thru inlet 85. Three-way valve 83 is in position where 85 to 87 is open and 85 to 86 is closed. The vacuum preferably of at least 500 mTorr is maintained by pumping out thru oulet 79 with valve 81 open connecting ducts 89 and 79. The valve 82 is closed allowing counter flow of plasma gas (upwards) relative to the particulate matter 60 flow (downwards). Similarly, for position b, valve 81 is closed, valve 83 connects 85 and 86, and valve 82 is open. In another embodiment, coflow of plasma gas is achieved by (in position a) closing valve 81, valve 83 connecting 85 and 86, and valve 82 is open. After the vacuum is maintained preferably at constant pressure, the electrical power is applied to coil 90 resulting in plasma discharge. Then, the valve 40 is opened allowing particulate matter 60 to fall under gravity into section 22 where it is exposed to plasma. Then thru an open valve 50, the particulate matter 60 enters the longitudinal middle portion 33 of the second hopper section 30. After all the particulate matter 60 is in the longitudinal middle portion 33 of the second hopper section 30, valve 50 is closed and valve 35 is open to expose particulate matter 60 to the polymerizable liquid monomer 70. A repeated plasma treatment can be obtained by placing the apparatus 1 in position b. The process would be similar and have the same sequence, since the apparatus 1 is symmetrical.

All the ducts/lines connected to the apparatus 1 are flexible to allow free rotation around axis B. The orifice size of valves 40 and 50 is preferably adjustable to control the flow rate of particulate matter 60. It is desirable to use some means of vibration in valves 40 and 50, and around sections 23, 21, 14, and 34 to maintain a stable flow of particulate matter 60.

Then a plasma glow discharge is created in the longitudinal middle section 20 by the non-polymerizable gas to form a plasma zone. The non-polymerizable gas is selected from the group consisting of helium, argon, oxygen, nitrogen, air, hydrogen, ammonium, fluorocarbon, and mixtures thereof. The non-polymerizable gas is preferably argon.

In the preferred embodiment, the plasma glow discharge is generated by using radio frequency, microwave power, or a combination thereof, and is desirably is generated in a modulated manner, including subsequent time-on and time-off intervals.

Then the particulate matter 60 is dropped from one of (i) first hopper section 10 and (ii) second hopper section 30, into the plasma zone in the longitudinal middle section 20, and exposed to the plasma glow discharge as the particulate matter 60 descends through the longitudinal middle section 20. Thereafter, the plasma treated particulate matter is collected in one of the first hopper section 10 and the second hopper section 30, depending upon the rotational position. Thereafter, the vacuum processing chamber 1 is rotated about the second longitudinal axis B such that the vacuum processing chamber 1 is at a rotational position "b".

The previous four steps, i.e., the steps of dropping, treating, and collecting the particulate matter and rotating the vacuum processing chamber are repeated for a number of times sufficient to obtain a total residence time preferably in a range of from about 0.001 seconds to about 60 seconds, and more preferably from about 0.5 seconds to about 60 seconds. The term "residence time" as used herein, means the total time taken by a particle to fall through the plasma zone of the middle longitudinal section.

Thereafter, preferably a polymerizable liquid monomer 70 is provided into one of the first hopper section 10 and the second hopper section 30, depending upon the rotational position, through the polymerizable liquid monomer valve 35. The polymerizable liquid monomer 70 is selected from the group consisting of acrylic and methacrylic acid of the general formula $H_2C\!=\!C(R_2)\!-\!C(O)OH$, acrylates and methacrylates of the general formula $H_2C\!=\!C(R_2)\!-\!C(O)OR_3$, acrylamides and methacrylamides of the general formula $(R_2)(R_2)C\!=\!C(R_2)\!-\!C(O)NHR_3$, maleic and fumaric acid of the general formula $HO(O)C\!-\!C(R_2)\!=\!C(R_2)\!-\!C(O)OH$, maleates and fumarates of the general formula $R_3O(O)C\!-\!C(R_2)\!=\!C(R_2)C(O)OR_3$, vinyl ethers of the general formula $(R_2)(R_2)C\!=\!C(R_2)\!-\!O\!-\!R_3$, N-vinyl-2-pyrollidone of the formula $(R_2)(R_2)C\!=\!C(R_2)\!-\!N\!-\!CH_2\!-\!CH_2\!-\!CH_2\!-\!C(O)$, vinyl acetate of the general formula $(R_2)(R_2)C\!=\!C(R_2)\!-\!OC(O)CH_3$, and aliphatic vinyl compounds of the general formula $R_2CH\!=\!CHR_3$, and mixtures thereof; where each $R_2$ is independently hydrogen or $C_1$–$C_{10}$ alkyl, and each $R_3$ is independently an aliphatic hydrocarbon group of up to about 10 carbon atoms that is unsubstituted or substituted by one or more of carboxy, hydroxy, amino, or a (poly)ethylene oxide group optionally substituted by one or more sulfate, phosphate, or sulfonate groups, or mixtures of such groups. Alternatively, the polymerizable liquid monomer is selected from the group consisting of fluoro-mono and polyacrylate, fluoroolefin, fluorostyrene, fluoroalkylene oxide, fluorinated vinyl alkyl ether monomers, or the copolymers thereof with suitable comonomers, wherein the comonomers are fluorinated or unfluorinated.

Finally, the treated particulate matter is preferably exposed to the polymerizable liquid monomer 70. Preferably, the polymerizable liquid monomer 70 is vaporized to form a non-polymerizable monomer vapor prior to exposing treated particulate matter to the polymerizable liquid monomer 70.

Accordingly, having thus described the invention in detail, it will be obvious to those skilled in the art that various changes may be made without departing from the scope of the invention and the invention is not to be considered limited to what is described in the specification.

What is claimed is:

1. An apparatus for plasma induced graft polymerization of particulate matter in a continuous or semi-continuous manner, comprising:

a vacuum processing chamber comprising a first hopper section, a longitudinal middle section, and a second hopper section;

said first hopper section having an inlet, a closed end, a longitudinal middle portion and an open end, said first hopper section being oriented along a first longitudinal axis, and said inlet of said first hopper section being removably connectable to a particulate matter feed valve;

said longitudinal middle section having a first open end, a longitudinal middle portion, and a second open end, said longitudinal middle section being oriented along said first longitudinal axis;

said vacuum processing chamber being rotatable at the mid-point of said longitudinal middle section through at least 180 degrees about a second longitudinal axis, said second longitudinal axis being perpendicular to said first longitudinal axis;

said second hopper section having an inlet, a closed end, a longitudinal middle portion and an open end, said second hopper section being oriented along said first longitudinal axis, and said inlet of said second hopper section being removably connectable to a polymerizable liquid monomer feed valve;

said open end of said first hopper section being connected with said first open end of said longitudinal middle section through a first valve;

said open end of said second hopper section being connected with said second open end of said longitudinal middle section through a second valve;

said particulate matter feed valve being removably connected to said inlet of said first hopper section and said polymerizable liquid monomer feed valve being removably connected to said inlet of said second hopper section when said vacuum processing chamber is at a rotational position "a", and said particulate matter feed valve being removably connected to said inlet of said second hopper section and said polymerizable liquid monomer feed valve being removably connected to said inlet of said first hopper section when said vacuum processing chamber is at a rotational position "b", wherein said rotational position "b" is 180 degrees with respect to said rotational position "a";

said first hopper section being adapted to deliver untreated and plasma treated particulate matter to said longitudinal middle section and said second hopper section being adapted to receive one or more of plasma treated particulate matter from said longitudinal middle section and said polymerizable liquid monomer when said vacuum processing chamber is at rotational position "a";

said second hopper section being adapted to deliver untreated and plasma treated particulate matter to said longitudinal middle section and said first hopper section being adapted to receive one or more of said plasma treated particulate matter from said longitudinal middle section and said polymerizable liquid monomer when said vacuum processing chamber is at rotational position "b";

said longitudinal middle section being connected to a vacuum generation pump means for maintaining a vacuum or near-atmospheric pressure therein; and said longitudinal middle section having plasma generating electrodes disposed therein for generating a plasma glow discharge using a non-polymerizable plasma gas for exposing said particulate matter to said plasma glow discharge, as said particulate matter descends through said longitudinal middle section under gravity.

2. The apparatus according to claim 1, wherein said longitudinal middle section is connected to pressure sensing means for measuring the pressure therein.

3. The apparatus according to claim 1, wherein said longitudinal middle section is connected to an optical emission spectrometer means for plasma diagnostics.

4. The apparatus according to claim 1, wherein said longitudinal middle section is connected to a langmuir probe means for plasma diagnostics.

5. The apparatus according to claim 1, wherein said longitudinal middle section is connected to a mass spectrometer means for plasma diagnostics.

6. The apparatus according to claim 1, wherein said vacuum generation pump means is adapted to produce a vacuum of at least about 500 mTorr.

7. A process for plasma induced graft polymerization of particulate matter in a continuous or semi-continuous manner, comprising the steps of:

(a) providing a vacuum processing chamber comprising:
  a vacuum processing chamber comprising a first hopper section, a longitudinal middle section, and a second hopper section;
  said first hopper section having an inlet, a closed end, a longitudinal middle portion and an open end, said first hopper section being oriented along a first longitudinal axis, and said inlet of said first hopper section being removably connectable to a particulate matter feed valve;
  said longitudinal middle section having a first open end, a longitudinal middle portion, and a second open end, said longitudinal middle section being oriented along said first longitudinal axis;
  said vacuum processing chamber being rotatable at the mid-point of said longitudinal middle section through at least 180 degrees about a second longitudinal axis, said second longitudinal axis being perpendicular to said first longitudinal axis;
  said second hopper section having an inlet, a closed end, a longitudinal middle portion and an open end, said second hopper section being oriented along said first longitudinal axis, and said inlet of said second hopper section being removably connectable to a polymerizable liquid monomer feed valve;
  said open end of said first hopper section being connected with said first open end of said longitudinal middle section through a first valve;
  said open end of said second hopper section being connected with said second open end of said longitudinal middle section through a second valve;
  said particulate matter feed valve being removably connected to said inlet of said first hopper section and said polymerizable liquid monomer feed valve being removably connected to said inlet of said second hopper section when said vacuum processing chamber is at a rotational position "a", and said particulate matter feed valve being removably connected to said inlet of said second hopper section and said polymerizable liquid monomer feed valve being removably connected to said inlet of said first hopper section when said vacuum processing chamber is at a rotational position "b", wherein said rotational position "b" is 180 degrees with respect to said rotational position "a";

(b) rotating said vacuum processing chamber about said second longitudinal axis such that said vacuum processing chamber is at a rotational position "a";

(c) providing particulate matter into said first hopper section through said particulate matter feed valve;

(d) providing a vacuum of at least 500 mTorr in said longitudinal middle section;

(e) creating a plasma glow discharge in said longitudinal middle portion by said non-polymerizable gas and forming a plasma zone;

(f) dropping said particulate matter from one of said first hopper section and said second hopper section into said plasma zone in said longitudinal middle section;

(g) treating said particulate matter in said plasma zone as said particulate matter descends through said longitudinal middle section;

(h) collecting said plasma treated particulate matter in one of said first hopper section and said second hopper section;

(i) rotating said vacuum processing chamber about said second longitudinal axis such that said vacuum processing chamber is at a rotational position "b";

(j) repeating steps (f), (g), (h) and (i) for a number of times sufficient to obtain a total residence time in a range of from about 0.001 seconds to 60 seconds;

(k) providing said polymerizable liquid monomer into one of said first hopper section and said second hopper section, through said polymerizable liquid monomer valve; and (l) exposing treated particulate matter to said polymerizable liquid monomer.

8. The process according to claim 7, wherein said residence time is in a range of from about 0.5 seconds to about 60 seconds.

9. The process according to claim 7, including providing a vacuum of at least 20 mTorr in said longitudinal middle section.

10. The process according to claim 7, wherein the consumption of said non-polymerizable gas is in a range from about 1 sccm to about 1000 sccm.

11. The process according to claim 7, wherein the non-polymerizable gas is selected from the group consisting of helium, argon, oxygen, nitrogen, air, hydrogen, ammonium, fluorocarbon, and mixtures thereof.

12. The process according to claim 7, wherein said polymerizable liquid monomer is vaporized to form a non-polymerizable monomer vapor prior to exposing treated particulate matter to said polymerizable liquid monomer.

13. The process according to claim 7, wherein said plasma glow discharge is generated by using radio frequency, microwave power, or a combination thereof.

14. The process according to claim 7, wherein said polymerizable liquid monomer is selected from the group consisting of acrylic and methacrylic acid of the general formula $H_2C=C(R_2)-C(O)OH$, acrylates and methacrylates of the general formula $H_2C=C(R_2)-C(O)OR_3$, acrylamides and methacrylamides of the general formula $(R_2)(R_2)C=C(R_2)-C(O)NHR_3$, maleic and fumaric acid of the general formula $HO(O)C-C(R_2)=C(R_2)-C(O)OH$, maleates and fumarates of the general formula $R_3O(O)C-C(R_2)=C(R_2)C(O)OR_3$, vinyl ethers of the general formula $(R_2)(R_2)C=C(R_2)-O-R_3$, N-vinyl-2-pyrollidone of the formula $(R_2)(R_2)C=C(R_2)-NCH_2-CH_2-CH_2-C(O)$, vinyl acetate of the general formula $(R_2)(R_2)C=C(R_2)-OC(O)CH_3$, and aliphatic vinyl compounds of the general formula $R_2CH=CHR_3$, and mixtures thereof; where each $R_2$ is independently hydrogen or $C_1-C_{10}$ alkyl, and each $R_3$ is independently an aliphatic hydrocarbon group of up to about 10 carbon atoms that is unsubstituted or substituted by one or more of carboxy, hydroxy, amino, or a (poly)ethylene oxide group optionally substituted by one or more sulfate, phosphate, or sulfonate groups, or mixtures of such groups.

15. The process according to claim 7, wherein said polymerizable liquid monomer is selected from the group consisting of fluoro-mono and polyacrylate, fluoroolefin, fluorostyrene, fluoroalkylene oxide, fluorinated vinyl alkyl ether monomers, or the copolymers thereof with suitable comonomers, wherein the comonomers are fluorinated or unfluorinated.

16. The process according to claim 7, wherein said plasma glow discharge is generated in a modulated manner, including subsequent time-on and time-off intervals.

17. The process according to claim 7, wherein said polymerizable liquid monomer is provided into the longitudinal middle section.

* * * * *